United States Patent
Engelvin et al.

(10) Patent No.: US 8,708,720 B2
(45) Date of Patent: Apr. 29, 2014

(54) DEVICE FOR INSERTING, EXTRACTING AND LOCKING AN ELECTRONIC CARD IN A SLOT

(75) Inventors: Pierre-Louis Engelvin, Balma (FR); Patrice Lafont, Mons (FR)

(73) Assignee: Airbus Operations (S.A.S.), Toulouse (FR)

( * ) Notice: Subject to any disclaimer, the term of this patent is extended or adjusted under 35 U.S.C. 154(b) by 0 days.

(21) Appl. No.: 13/598,927

(22) Filed: Aug. 30, 2012

(65) Prior Publication Data

US 2013/0228538 A1  Sep. 5, 2013

(30) Foreign Application Priority Data

Sep. 2, 2011  (FR) ...................................... 11 57818

(51) Int. Cl.
*H01R 13/62* (2006.01)

(52) U.S. Cl.
USPC .......................................................... 439/160

(58) Field of Classification Search
USPC ......................................... 439/160, 157, 159
See application file for complete search history.

(56) References Cited

U.S. PATENT DOCUMENTS

| | | | | |
|---|---|---|---|---|
| 4,083,616 A * | 4/1978 | McNiece et al. | | 439/157 |
| 4,313,150 A * | 1/1982 | Chu | | 361/755 |
| 4,480,287 A * | 10/1984 | Jensen | | 361/707 |
| 4,521,063 A * | 6/1985 | Milc | | 439/55 |
| 4,606,591 A * | 8/1986 | Bloch | | 439/157 |
| 5,003,431 A * | 3/1991 | Imsdahl | | 361/798 |
| 5,224,016 A * | 6/1993 | Weisman et al. | | 361/728 |
| 5,290,122 A * | 3/1994 | Hulme | | 403/374.4 |
| 5,317,482 A * | 5/1994 | Bujtas | | 361/798 |
| 6,443,315 B1 * | 9/2002 | Tabuchi | | 211/41.17 |
| 7,284,997 B2 * | 10/2007 | Joist | | 439/157 |
| 7,349,221 B2 * | 3/2008 | Yurko | | 361/719 |
| 2013/0003328 A1 * | 1/2013 | Engelvin et al. | | 361/759 |

* cited by examiner

*Primary Examiner* — James Harvey
(74) *Attorney, Agent, or Firm* — Jenkins, Wilson, Taylor & Hunt, P.A.

(57) ABSTRACT

A device for clamping in a slot an electronic card including contacts insertable into connectors, guided by the slot between a first position of the electronic card, the extraction position, where the contacts are not inserted into the connectors, and a second position, the insertion position, where said contacts are fully inserted into the connectors; the device includes clamping means, means of controlling the clamping means, tightening means comprising a first eccentric having a pivoting connection with the electronic card able to control the clamping means, and the tightening means in a second eccentric working with means forming a bearing surface to produce an instantaneous center of rotation of the tightening means on the bearing surface when the electronic card is in the insertion position and the tightening means are operated around the pivot axis for inserting the electronic card.

8 Claims, 2 Drawing Sheets

DEVICE FOR INSERTING, EXTRACTING AND LOCKING AN ELECTRONIC CARD IN A SLOT

CROSS-REFERENCE TO RELATED APPLICATIONS

This application claims priority to French Patent Application No. 11 57818 filed Sep. 2, 2011, the entire disclosure of which is herein incorporated by reference.

FIELD OF THE INVENTION

The invention relates to a device for inserting, extracting and locking an electronic card in a slot. The invention is more specifically, but not exclusively, intended for installing electronic cards in on-board computers, more particularly in aircraft, said computers, and their content, being subjected to major constraints, in particular vibration.

STATE OF THE ART

Changing requirements in the field of on-board electronics generate a significant increase in the number of signals to be carried between the electronic cards of the computers in the vehicles in question and result in a significant growth in the density, in number of connection points, of the connectors of said electronic cards. However, to ensure a reliable electrical connection for each of these connection points, the application of a surface pressure, normal to the surfaces in contact, between the male and female parts of the connection is recommended. The friction between these two surfaces then generates a force, called a holding force, tangential to the contact surfaces. This holding force can generate significant connection and disconnection loads. Thus, it is common to see, for an electronic card's connector, a holding force of the order of 0.7 Newtons per contact point, while such an electrical card can commonly comprise up to 500 connection points. This holding force thus generates an insertion or extraction force for said electronic card of the order of 350 Newtons. Such electronic cards are frequently placed in areas that are not easily accessible and that, in addition, have few possibilities for gripping. Thus installing and removing such an electronic card are tricky operations, and the application of such loads by various, non-adapted tools on said electronic card can result in degradations to it.

When the electronic card is used in a computer mounted on board a vehicle, in particular on board an aircraft, it must also be locked in a rack, generally by slots. This locking performs a mechanical function of maintaining the electronic card in its slot and participates in a thermal function of cooling the card, which is cooled in particular by means of its contact with said slots. This locking is currently performed by means of a device with corners, derived from devices used in printing to immobilize a composition in a frame. Such a device comprises means of tightening, in particular by screws, and its operation requires a tool such as a screwdriver or wrench. Thus it is tempting, for operators who are not very careful, to use said tool to loosen the locking means and then to use it as a lever to extract the card, with the risks that involves of degradation to this card.

Document U.S. Pat. No. 5,224,016 describes a device for locking an electronic card in a mounting groove on a rack, which device comprises an eccentric allowing the locking means to be operated and also, through a bracket on the edge of the rack, to exercise via a leverage effect an extraction force able to overcome the holding force of all the card's contacts. However, this device requires the use of additional means to override the holding forces of the contacts when the electronic card is inserted. In effect, the device's configuration makes it possible to have a bracket forming a lever arm when the electronic card is extracted and thus overcome the contacts' holding forces during this extraction. However, this device of the prior state of the art only allows a bracket able to create a lever arm for inserting said electronic card to be provided over a very limited angular range corresponding to the very beginning of the insertion. In addition, the operation of the device beyond this limited range leads to the actuation of locking means that are thus opposed to the card's insertion.

DESCRIPTION OF THE INVENTION

The invention aims to overcome the disadvantages of the prior state of the art and to this end proposes a device for clamping in a slot an electronic card comprising contacts able to be inserted into connectors via a longitudinal movement of said electronic card, guided by said slot extending longitudinally, between a first position of the electronic card, so called the extraction position, where the contacts are not inserted into the connectors and a second position, so called the insertion position, where said contacts are fully inserted into the connectors; said device comprises:

a) clamping means able to cause a tightening, so called transversal tightening, on sides of the slot;

b) means of controlling the clamping means, having a sliding connection with the electronic card and able to cause the transversal tightening of the clamping means by a longitudinal movement of said means of controlling the clamping means relative to the electronic card;

c) means, so called tightening means, comprising a first eccentric having a pivoting connection with the electronic card according to an axis perpendicular to the longitudinal direction and able to cause a longitudinal translation movement of the means of controlling the clamping means by a rotation of said tightening means around said pivot axis;

d) said tightening means comprise a second eccentric relative to the pivot axis working with means forming a bearing surface fully linked to the slot to produce an instantaneous center of rotation of the tightening means on said bearing surface when the electronic card is in the extraction position and the tightening means are operated around the pivot axis for inserting the electronic card.

In this way the device of the invention makes it possible to benefit from a lever effect by taking maximum advantage of the extraction force and insertion force in an angular operating range of the tightening means, corresponding to situations where the insertion and extraction loads are highest, and to perform insertion/extraction and locking/unlocking operations by the same operation of the same tightening means.

The invention can be implemented according to advantageous embodiments, described below, each of which may be considered individually or in any technically operable combination.

According to an advantageous embodiment, the bearing surface comprises two stops separated longitudinally; one is used for inserting the electronic card and the other for extracting the electronic card. This is an especially simple and economical embodiment.

Advantageously, the two stops separated longitudinally are formed by sides of a groove extending transversally. Thus, this feature can be easily integrated into a rack, either by machining when said rack is manufactured, or by fitting a substantially U-shaped profile on the front of said rack.

According to a particularly advantageous embodiment using this bearing surface, the second eccentric of the tightening means and the sides of the groove work together to produce an instantaneous center of rotation of the tightening means when the electronic card is in the insertion position and when the tightening means are operated around the pivot axis to extract the electronic card.

Advantageously the height in a vertical direction perpendicular to the longitudinal and transversal directions of the stop used for inserting the electronic card is less than that of the stop used for extracting the electronic card. In this way, the electronic card can be inserted or extracted by means of the tightening means using the same angular movement around the same pivot axis and in the same plane of rotation of the tightening means.

According to a particular embodiment of the device of the invention, the clamping device comprises:

i. two first jaws, separated longitudinally, having a sliding connection in a longitudinal direction with respect to the electronic card;

ii. a third jaw, mobile in a transversal direction, perpendicular to the longitudinal direction, having a sliding connection with the first two jaws along surfaces forming a corner, according to a corner angle relative to the longitudinal direction, such that a longitudinal lessening of the distance, so called tightening lessening of the distance, between the first two jaws produces a transversal movement of the third jaw;

the tightening means act on one of the first two jaws, the other first jaw being fixed longitudinally.

This embodiment is compatible with the known devices of the prior state of the art.

Advantageously, the second eccentric's contact with one of the stops is achieved with an involute profile. In this way, the insertion and extraction movements are realized, at least partially and preferably during the phases requiring the greatest force, by slip-free rolling at the point of contact with the stop, thus producing maximum efficiency.

The invention also relates to a ready-to-fit kit comprising:

i. a lever comprising tightening means according to feature d) of the device of the invention;

ii a profile able to be fitted on a front surface of a rack, said rack comprising slots for inserting electronic cards; said profile comprises a wing able to form a stop for the second eccentric of the tightening means.

Thus the device of the invention can advantageously be installed instead and in place of a device according to the prior state of the art.

PRESENTATION OF THE FIGURES

The invention is described below according to various preferred, non-limiting embodiments and with reference to FIGS. 1 to 4 in which.

Figure 2:
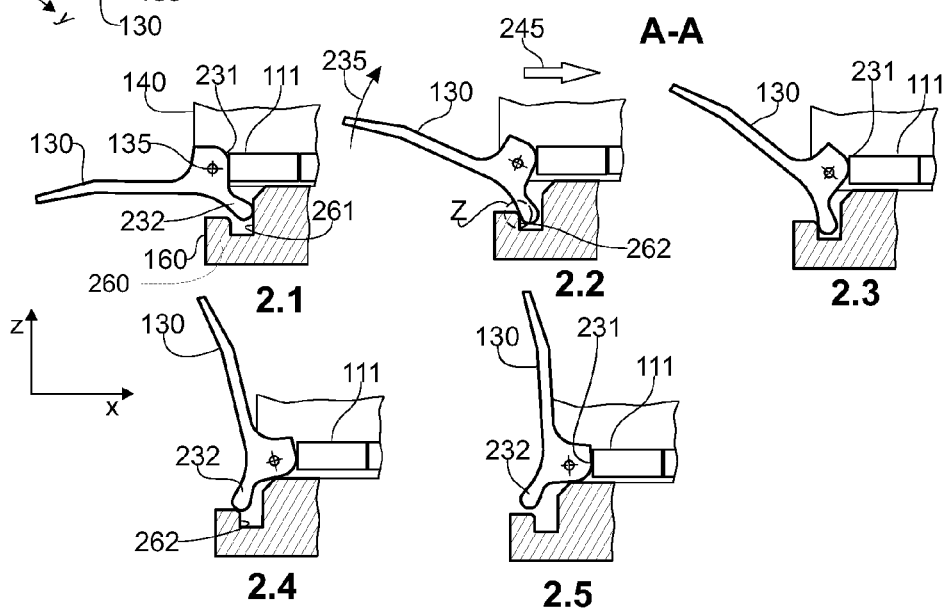
FIG. 2 illustrates, in a cross-section view along AA defined in FIG. 1, the various steps (FIGS. 2.1 to 2.5) of inserting and locking an electronic card using the means that are the subjects of the invention.
Figure 4:
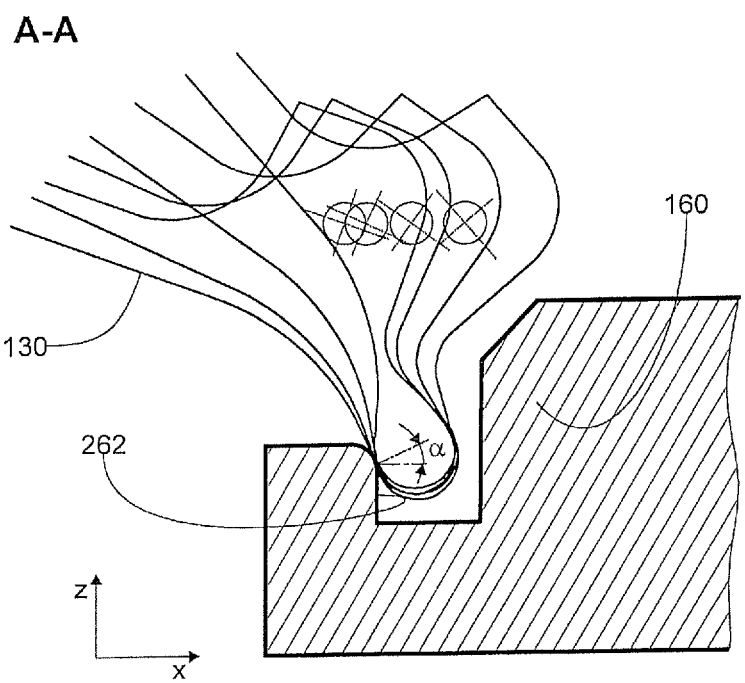

and FIG. 4 is a detailed view according to Z, defined in FIG. 2.2, of the contact between the second eccentric of the tightening means and one of the stops according to an example of realization of the invention.

DETAILED DESCRIPTION OF EMBODIMENTS OF THE INVENTION

Figure 1:
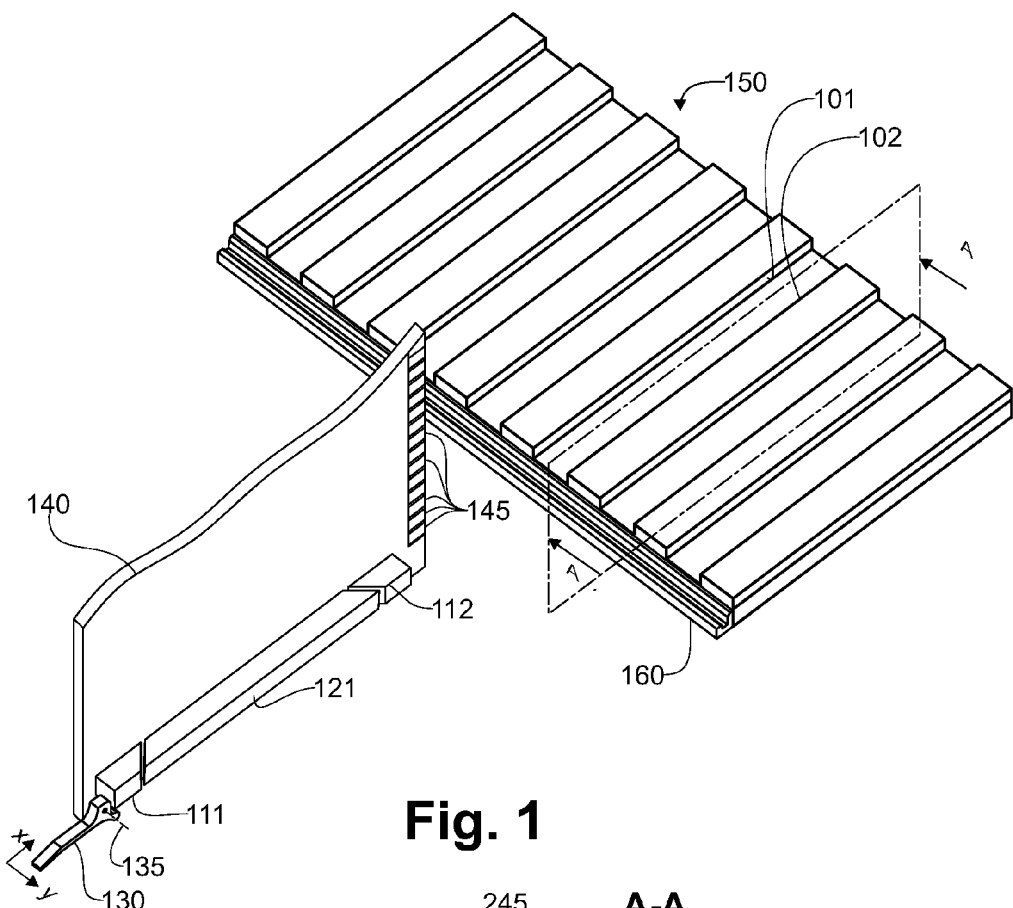
FIG. 1 shows, in a perspective view, an example of realization of a device according to the invention applied to the installation of an electronic card in a rack comprising grooves.

As shown in FIG. 1, the device of the invention is designed to facilitate the insertion and extraction of an electronic card 140 comprising a plurality of contacts 145 likely to generate a force, called a holding force, mainly oriented in a longitudinal direction x opposed to said electronic card's movement when it is inserted or extracted.

The device of the invention is designed for the installation of an electronic card 140 in a rack 150 comprising grooves extending longitudinally x; the electronic card 150 comprises means of locking 111, 121, 112 by clamping, so called clamping means, able to realize a tightening, in a transversal direction y, on the sides 101, 102 of the grooves of the rack 150.

The device of the invention comprises a lever 130 having a pivoting connection with respect to the electronic card 140 along a transversal axis 135.

According to an example of realization, the clamping means comprise a jaw 112 fixed relative to the electronic card 140 and a mobile jaw 111 having a sliding connection in a longitudinal direction x relative to said electronic card 140. A third jaw 121 has a sliding connection with the two other jaws 111, 112 along surfaces forming a corner, such that a longitudinal lessening of the distance between the fixed jaw 112 and the mobile jaw 111 produces a transversal movement y of this third jaw. The longitudinal movement of the mobile jaw 111 is caused by the operation, in rotation around the pivot axis 135, of the lever 130 of the tightening means. Thus, according to this example of realization, the longitudinally mobile jaw 111 constitutes a means of controlling the clamping means.

Other embodiments can be envisaged without departing from the scope of the invention. Thus, for example, a transversal tightening for clamping the electronic card can be obtained by the transversal buckling deformation of an elastic blade.

As FIG. 2 shows, the tightening means comprise two eccentrics 231, 232 linked to the lever 130 of the tightening means. A first eccentric 231 acts on the means 111 of controlling the clamping means for locking and unlocking the electronic card; the other eccentric 232 acts on stops placed in front of the rack 150 when the electronic card is inserted or extracted. According to this example of realization, the stops are produced by a profile 160 comprising a groove extending in the transversal direction y and forming a wing 260; the interior sides 261, 262 of said groove form said stops.

In a first step, illustrated in FIG. 2.1, the electronic card is inserted in one of the longitudinal grooves of the rack 150, while the lever 130 of the tightening means is placed in a position substantially parallel to the longitudinal direction. In this configuration, the first eccentric 231 presents a minimum eccentricity relative to the pivot axis 135 along this longitudinal direction, and consequently produces no movement of the clamping means and, as a result, no tightening on the sides of the groove of the rack. The extremity of the second eccentric 232 comes to rest against the side 261 of the groove of the profile 160 placed in front of the rack; this side 261 is the one located closest to the longitudinal extremity of said rack 150.

Then, as FIG. 2.2 illustrates, starting from the position in FIG. 2.1, a rotation 235 of the lever 130 controlling the tightening means, clockwise according to this example of realization and the view of this figure, tending to bring the extremity of said lever closer to the electronic card 140, makes the extremity of the second eccentric 232 come into contact with the stop formed by the other side 262 of the groove and wing 260 of the profile 160, before the first eccentric 231 produces a significant movement of the means 111 of controlling the clamping means. The bearing point of the second eccentric 232 on said side 262 of the groove and wing 260 thus forms an instantaneous center of rotation of the tightening means and continuing the rotational action 235 of the lever 130 produces a longitudinal advancement 245 of the electronic card, as if the pivot axis 135 of the lever turned around this instantaneous center of rotation.

Then, as FIG. 2.3 shows, continuing the rotational action on the lever 130 of the tightening means continues the longitudinal translation of the electronic card 140. Beyond an angle determined by the profile of the first eccentric 231, said first eccentric begins to move the means 111 controlling the clamping means without generating a tightening likely to be opposed to the electronic card's longitudinal translation.

As FIG. 2.4 shows, beyond an angle determined by the profile of the second eccentric and the side 262 of the transversal groove forming its stop, said second eccentric 232 leaves contact with the stop 262. The main effect of the rotation of the lever 130 is then the movement of the means of controlling 111 the clamping means so as to achieve the locking of the electronic card in the rack slot.

FIG. 2.5 illustrates the fact that the end of the angular run of the lever 130 controlling the tightening means basically performs the locking of the electronic card in the rack's groove; this locking is achieved by the profile of the first eccentric 231, whose contact surface with the means 111 of controlling the clamping means results in an orientation of the force exercised by said means 111 on the eccentric 231, in intersection with the pivot axis 135 of said eccentric 231.

Figure 3:
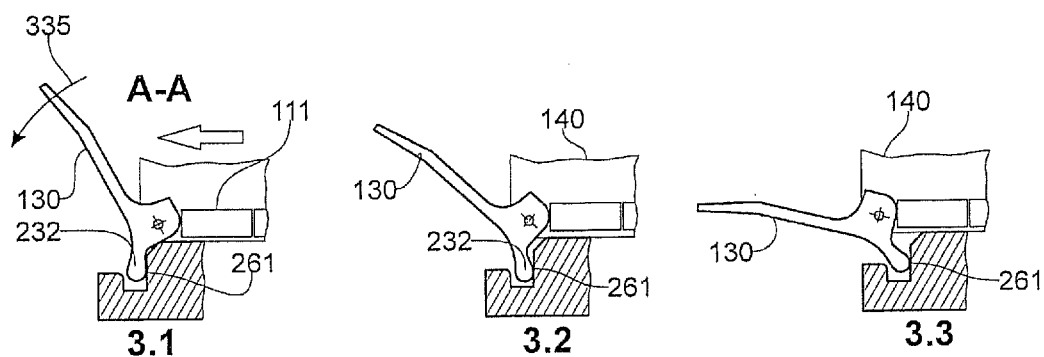
FIG. 3 shows, in a cross-section view along AA the steps (FIGS. 3.1 to 3.3) of extracting an electronic card using the means that are the subjects of the invention according to an example of realization of it.

The electronic card and the tightening means being in the insertion position, i.e. corresponding to the position in FIG. 2.5, an action 335 in the opposite direction, illustrated in FIG. 3.1, on the lever 130 of the tightening means allows the electronic card's extraction to be initiated. From the start of the anti-clockwise rotation 335 of this lever 130, the profile of the first eccentric 231 begins to free the means 111 of controlling the clamping means, thus reducing the pressure on the sides of the longitudinal groove of the rack. The second eccentric 232 comes to rest against the side 261 of the transversal groove closest to the rack in the longitudinal direction x, producing an instantaneous center of rotation there, which makes it possible to benefit from a leverage effect for extracting the electronic card 140.

In the following steps, illustrated in 3.2 and 3.3, by continuing the anti-clockwise rotation of the lever 130 the second eccentric 232 remains in contact with the same side 261 of the transversal groove, making it possible to benefit from the leverage effect until the said electronic card 140 is completely extracted when said lever 130 reaches a position substantially parallel to the longitudinal direction substantially equivalent to the position shown in FIG. 2.1.

The choice of the profile of the second eccentric 232 in contact with the surfaces forming stops, here the side 262 farthest from the rack of the transversal groove, and the profile of this surface forming a stop advantageously makes it possible to obtain a slip-free rolling of said eccentric 232 on said surface 262, as shown in FIG. 4. This contact is achieved according a substantially constant pressure angle ☐ ☐. This pressure angle can be chosen to orient the effort at the pivoting connection between the electronic card 140 and the lever 130 of the tightening means. Thus, the pressure angle will be determined such that the vertical component (along z) of this reaction force at the pivot point (along x) of this force is maximized. The same logic applies during the extraction operation.

The longitudinal stop means 261, 262 on which the second eccentric 232 rests can be produced by machining the extremity of the rack, or by giving this extremity a suitably-shaped profile 160. Thus, by starting for example with a device of the prior state of the art as described in document U.S. Pat. No. 5,224,016, this device of the prior state of the art can be modified by replacing the existing lever by a lever 130 comprising two eccentrics 231, 232 according to one of the embodiments of the invention and by giving the longitudinal extremity of the rack such a profile 160.

The above description and examples of realization show that the invention has achieved the goals it envisages. In particular, the device that is the subject of the invention makes it possible to easily perform the insertion/extraction and locking/unlocking of an electronic card 140 comprising numerous connection points 145 in a rack 150 with longitudinal grooves, in a single operation of a lever 130, fitted at said electronic card, with no additional tool, the movement of said lever 130 is performed in a plane (x-z) comprising the longitudinal direction x, and which thus presents reduced dimensions. The device of the invention can also be adapted to existing electronic cards and racks.

The invention claimed is:

1. A Device for clamping in a slot an electronic card comprising contacts able to be inserted into connectors via a longitudinal movement of said electronic card, guided by said slot extending longitudinally, between a first position of the electronic card, so called the extraction position, where the contacts are not inserted into the connectors, and a second position, so called the insertion position, where said contacts are fully inserted into the connectors; said device comprises:
    a) clamping means able to cause a tightening, so called transversal tightening, on sides of the slot;
    b) means of controlling the clamping means, having a sliding connection with the electronic card and able to cause the transversal tightening of the clamping means by a longitudinal movement of said means of controlling the clamping means relative to the electronic card;
    c) means, so called tightening means, comprising a first eccentric having a pivoting connection with the electronic card according to an axis perpendicular to the longitudinal direction and able to cause a longitudinal translation movement of the means of controlling the clamping means by a rotation of said tightening means around said pivot axis;
    d) wherein said tightening means comprise a second eccentric relative to the pivot axis working with means forming a bearing surface fully linked to the slot to produce an instantaneous center of rotation of the tightening means on said bearing surface when the electronic card is in the extraction position and the tightening means are operated around the pivot axis for inserting the electronic card.

2. The device according to claim 1, wherein the bearing surface comprises two stops separated longitudinally; one is used for inserting the electronic card and the other for extracting the electronic card.

3. The device according to claim 2, wherein the two stops separated longitudinally are formed by sides of a groove extending transversally.

4. The device according to claim 3, wherein the second eccentric of the tightening means and the sides of the groove work together to produce an instantaneous center of rotation of the tightening means when the electronic card is in the insertion position and the tightening means are operated around the pivot axis to extract the electronic card.

5. The device according to claim 4, wherein the height in a direction perpendicular to the longitudinal and transversal directions of the stop used for inserting the electronic card is less than that of the stop used for extracting the electronic card.

6. The device according to claim 1, wherein the clamping means comprise:
   i. two first jaws, separated longitudinally, having a sliding connection in a longitudinal direction with respect to the electronic card;
   ii. a third jaw, mobile in a transversal direction, perpendicular to the longitudinal direction, having a sliding connection with the first two jaws along surfaces forming a corner, according to a corner angle relative to the longitudinal direction, such that a longitudinal lessening of the distance between the first two jaws produces a transversal movement of the third jaw;
the tightening means act on one of the first two jaws, the other first jaw being fixed longitudinally.

7. The device according to claim 2, wherein the second eccentric's contact with one of the stops is realized according to an involute profile.

8. A Ready-to-fit kit comprising:
   i a lever comprising tightening means according to feature d) of claim 1;
   ii a profile able to be fitted on a front face of a rack, said rack comprising slots for inserting electronic cards; said profile comprises a wing able to form a stop for the second eccentric of the tightening means.

* * * * *